(12) United States Patent
Shi

(10) Patent No.: US 11,056,604 B1
(45) Date of Patent: Jul. 6, 2021

(54) PHOTODIODE OF AVALANCHE BREAKDOWN HAVING MIXED COMPOSITE CHARGE LAYER

(71) Applicant: National Central University, Taoyuan (TW)

(72) Inventor: Jin-Wei Shi, Taoyuan (TW)

(73) Assignee: National Central University, Taoyuan (TW)

( * ) Notice: Subject to any disclaimer, the term of this patent is extended or adjusted under 35 U.S.C. 154(b) by 1 day.

(21) Appl. No.: 16/793,765

(22) Filed: Feb. 18, 2020

(51) Int. Cl.
*H01L 31/107* (2006.01)
*H01L 31/0352* (2006.01)
*H01L 31/0304* (2006.01)

(52) U.S. Cl.
CPC .... *H01L 31/1075* (2013.01); *H01L 31/03046* (2013.01); *H01L 31/03529* (2013.01)

(58) Field of Classification Search
None
See application file for complete search history.

(56) References Cited

U.S. PATENT DOCUMENTS

| | | | | |
|---|---|---|---|---|
| 5,187,553 A * | 2/1993 | Makita | ............ | B82Y 20/00 257/187 |
| 5,308,995 A * | 5/1994 | Tsuji | ............ | B82Y 20/00 257/17 |
| 6,417,528 B1 * | 7/2002 | Bond | ............ | H01L 31/1075 257/184 |
| 7,432,537 B1 * | 10/2008 | Huntington | ............ | B82Y 20/00 257/186 |
| 9,466,751 B1 * | 10/2016 | Shi | ............ | H01L 31/107 |
| 9,748,429 B1 * | 8/2017 | Davids | ............ | G02B 6/12004 |
| 2002/0117697 A1 * | 8/2002 | Tanaka | ............ | H01L 31/035281 257/288 |
| 2005/0029541 A1 * | 2/2005 | Ko | ............ | H01L 31/107 257/186 |
| 2006/0084187 A1 * | 4/2006 | Francis | ............ | H01L 31/03529 438/1 |
| 2009/0242933 A1 * | 10/2009 | Hu | ............ | H01L 31/107 257/186 |
| 2009/0242934 A1 * | 10/2009 | Hu | ............ | H01L 31/1075 257/186 |
| 2009/0315073 A1 * | 12/2009 | Shi | ............ | H01L 31/1075 257/185 |

(Continued)

*Primary Examiner* — Evren Seven
(74) *Attorney, Agent, or Firm* — Demian K. Jackson; Jackson IPG PLLC

(57) ABSTRACT

An avalanche photodiode (APD) is provided with a mixed composite charge layer. A novel structure of InAlAs is designed with the mixed layer. A single P-type field control layer is divided into three layers of different materials with each two forming a heterojunction structure. By controlling the relative concentration distributions and thicknesses of the first, second, and third P-type field control layers along with a mesa shape formed through chemical selective etching, a part of the second P-type field control layer is exposed to the air with a part of the first one etched out at the same time through this single structure having the mesa shape. Thus, the field of a multiplication layer is further confined at center to concentrate electric-field so that fringe field is low but not collapsed. Hence, the overall speed is increased, the intensity high, and sensitivity good while response is fast and efficiency high.

9 Claims, 4 Drawing Sheets

(56) References Cited

U.S. PATENT DOCUMENTS

| | | | | |
|---|---|---|---|---|
| 2010/0019275 | A1* | 1/2010 | Nakata | H01L 31/1075 257/186 |
| 2010/0163925 | A1* | 7/2010 | Ishibashi | H01L 31/1075 257/186 |
| 2011/0018086 | A1* | 1/2011 | Linga | H01L 31/1075 257/438 |
| 2011/0164645 | A1* | 7/2011 | Shi | H01S 5/042 372/50.11 |
| 2011/0241150 | A1* | 10/2011 | Ishibashi | H01L 31/1075 257/438 |
| 2011/0284927 | A1* | 11/2011 | Achouche | H01L 31/1075 257/186 |
| 2012/0025212 | A1* | 2/2012 | Kouvetakis | H01L 31/107 257/85 |
| 2013/0082286 | A1* | 4/2013 | Finkelstein | H01L 31/055 257/84 |
| 2013/0154045 | A1* | 6/2013 | Ishibashi | H01L 31/03046 257/438 |
| 2013/0292741 | A1* | 11/2013 | Huang | H01L 31/1075 257/186 |
| 2014/0093996 | A1* | 4/2014 | Ye | H01L 31/107 438/93 |
| 2014/0131827 | A1* | 5/2014 | Yamaguchi | H01L 31/1075 257/438 |
| 2014/0186991 | A1* | 7/2014 | Huang | H01L 31/1808 438/91 |
| 2016/0284919 | A1* | 9/2016 | Sampath | H01L 31/03044 |
| 2016/0300973 | A1* | 10/2016 | Shen | H01L 31/18 |
| 2019/0288026 | A1* | 9/2019 | Von Kaenel | H01L 27/14636 |
| 2019/0288132 | A1* | 9/2019 | Wang | H01L 31/0232 |
| 2019/0371956 | A1* | 12/2019 | Shi | H01L 31/022408 |
| 2021/0013357 | A1* | 1/2021 | Liang | H01L 31/035281 |

* cited by examiner

US 11,056,604 B1

PHOTODIODE OF AVALANCHE BREAKDOWN HAVING MIXED COMPOSITE CHARGE LAYER

TECHNICAL FIELD OF THE INVENTION

The present invention relates to an avalanche photodiode (APD); more particularly, to dividing a single P-type field control layer into three layers of different materials with each two neighboring layers forming a heterojunction structure, where the field of a multiplication layer (M-layer) is confined at center of the structure to concentrate electric-field so that fringe field is low but not collapsed with increased speed and high intensity for the whole structure.

DESCRIPTION OF THE RELATED ARTS

To meet much more demands of internet of things (IOT) for virtual machines using bit data, traditional copper wires have not been able to take on the transmission tasks (≥~100 meters (m)) for long. Optical fiber having limitless transmission bandwidth is still bound to be the only hope. Under consideration of market sizes, costs and expected technology developments for different transmission distances, a project group for 400 gigabit Ethernet (GbE) separately worked out interfaces for the transmission distances of 100 m, 500 m, 2 kilometers (km) and 10 km. Therein, the interface of 400 gigabits per second (Gbps) for 100 m was determined to transmit direct-modulation signals by a vertical cavity surface emitting laser (VCSEL, @850 nm) of 25 Gbps per channel in 100 GbE through a multimode fiber (MMF); yet, the target of 400 Gbps was achieved by multiplying the number of fibers and four-times laser-fibers. For the interface of more than 500 m, a light source of 1310 nanometers (nm) was used for transmission through single-mode fiber (SMF). Within the considerations of the project group, a solution could be that the signal velocity for each single light source achieved 50 Gbps or 100 Gbps and then eight or four channels were used (multiple wavelengths in a single fiber or a single wavelength in multiple fibers) to achieve the transmission capacity of 400 Gbps. However, when the speed for single light source in Ethernet reaches more than 25 Gbps, the high-bandwidth photo-receiver device (including the photoelectric conversion in the electro-optical modulating and receiving module of a transmitter module) normally had a smaller optical power output (about 1 milliwatts (mW); −2 to +2 decibels per milliwatt (dBm)). If the technology of wavelength division multiplexing (WDM) was continued to be used, the insertion loss in passive device would make the power budget become the key issue of limiting the maximum transmission capacity. As was revealed in Document 1: "Design and Performance of High-Speed Avalanche Photodiodes for 100-Gb/s Systems and Beyond" by M. Nada, T. Yoshimatsu, Y. Muramoto, H. Yokoyama, and H. Matsuzaki (IEEE/OSA Journal of Lightwave Technology, vol. 33, no. 5, pp. 984-990, March, 2015.), it was known from the causes of the insertion loss that the receiving end required a sensitivity about −13 dBm. A general receiver of p-i-n photodiode has a sensitivity about more than −10 dBm under the operation of 25 gigabits per second (Gbit/sec) bandwidth.

In FIG. 3, Document 2: "Degradation Mode Analysis on Highly Reliable Guarding-Free planar InAlAs Avalanche Photodiodes" by E. Ishimura, E. Yagyu, M. Nakaji, S. Ihara, K. Yoshiara, T. Aoyagi, Y. Tokuda, and T. Ishikawa (IEEE/OSA Journal of Lightwave Technology, vol. 25, pp. 3686-3693, December, 2007.) revealed a cross-section structure of an avalanche photodiode using an M-layer of planar indium aluminum arsenide (InAlAs). As shown in the figure, the high field region 3 had a zinc diffusion area restraining the field; but there is no mesa structure and, therefore, the field at the edge had poor confinement. The threshold (>550 kilo-volts per centimeter) of the breakdown field might be easily exceeded. When the M-layer was made thin, breakdown might happen at the edge for achieving required operation gain.

FIG. 4 shows a prior art of a cross-section structure of an APD of 25 Gbit/sec or 50 Gbit/sec developed by NTT Electronic in the last two years according to Document 1. From top to bottom, the structure comprised an N-contact layer 40, an edge-field buffer layer 41, an N-charge layer 42, an InAlAs avalanche layer 43, a P-charge layer 44, an undoped indium gallium arsenide (InGaAs) absorption layer 45, a P-type InGaAs absorption layer 46, a P-contact layer 47, a semi-insulating InP substrate 48 and an anti-reflection layer 49. In the figure, for achieving good fie ld confinement, the structure quite particularly had the InGaAs avalanche layer 43 and the N-contact layer 40 deposed near the surface (structure inverted). Consequently, most of the field of the InAlAs avalanche layer 43 would be restrained under the N-contact layer 40. However, for reducing the chance of surface breakdown, the excessive edge-field buffer layer 41 and N-charge layer 42 are required, which might result in impact on device speed. Besides, the inverted structure (p-side down) required the use of P-type InP-based alloy having a wider bandgap. As a result, the ohmic contact might be hard for production and the resistance of the whole device is made big. In addition, the structure also sacrificed the field confinement of the P-type InGaAs absorption layer 46, where the parasitic capacitance of the device might become bigger. Nevertheless, because of the stronger fringe field in the absorption layer, the difficulty of packaging the device was increased (Document 3: F Nakajima, M. Nada, and T. Yoshimatsu, "High-Speed Avalanche Photodiode and High-Sensitivity Receiver Optical Sub-Assembly for 100-Gb/s Ethernet," to be published in IEEE/OSA Journal of Lightwave Technology, vol. 33, 2015.) Hence, for restraining the field, the avalanche layer was deposed outside to be exposed in the air. This could cause reliability problem.

From the results of the sensitivity measured under the operations of 25 Gbit/sec and 50 Gbit/sec, it is clearly found that the sensitivity of 25 Gbit/sec and 50 Gbit/sec were approximately −15.5 dBm and −11 dBm. As compared to those of the p-i-n photodetector-based light receiving modules, the responses were increased for about 4 decibels (dB) and 1.5 dB, respectively. As the results showed, following the increase of data rate, the enhancement in the sensitivity of this breakdown photodiode structure would become smaller. It is most likely because that, following the increase in required operation bandwidth, the avalanche layer was required to be thinned. Yet, this made the dark current abruptly raised to deteriorate the sensitivity.

Under the above concerns, a prior art used a double-mesa structure to achieve the effect of field confinement of the avalanche layer. But, because holes run much slower than electronics, holes will be accumulated in intrinsic area to form a field shielding effect of making inner field smaller. Therefore, the discharging speed of carrier became slower to further affect the output power as the device was made much slower in speed. Accordingly, a prior art of an APD having a mesa shape was revealed. However, only an upper P-type field control layer was etched while a lower P-type field control layer was too far away with power scattered. As a result, field limitation was poor and edge was easily collapsed to further reduce the operating speed of the device. Hence, the prior arts do not fulfill all users' requests on actual use.

SUMMARY OF THE INVENTION

The main purpose of the present invention is to obtain a mixed composite charge layer by dividing a single P-type field control layer into three layers of different materials with each two neighboring layers forming a heterojunction structure, where, by controlling the relative concentration distributions and thicknesses of the first, second, and third P-type field control layers along with a mesa shape formed through chemical selective etching, a part of the second P-type field control layer is exposed to the air with a part of the first P-type field control layer being etched out at the same time through a single structure having a mesa shape; and, thus, the field of an M-layer is further confined at center to concentrate power so that fringe field is low but not collapsed with overall speed increased and intensity improved.

To achieve the above purpose, the present invention is a photodiode of avalanche breakdown having a mixed composite charge layer, comprising a P-type ohmic contact layer, an N-type ohmic contact layer, a P-type window layer, a first graded bandgap layer, a first absorption layer, a second absorption layer, a second graded bandgap layer, a first P-type field control layer, a second P-type field control layer, a third P-type field control layer, an M-layer, an N-type charge layer, and a transport layer, where the P-type ohmic contact layer is a first semiconductor $p^+$-doped; the N-type contact layer is a second semiconductor $n^+$-doped; the P-type window layer is a third semiconductor $p^+$-doped and deposed between the P-type ohmic contact layer and the N-type ohmic contact layer; the first graded bandgap layer is a fourth semiconductor $p^+$-doped and deposed between the P-type window layer and the N-type ohmic contact layer; the first absorption layer is a fifth semiconductor $p^-$-doped and deposed between the first graded bandgap layer and the N-type ohmic contact layer; the second absorption layer is a sixth semiconductor undoped and deposed between the first absorption layer and the N-type ohmic contact layer; the second graded bandgap layer is a seventh semiconductor undoped and deposed between the second absorption layer and the N-type ohmic contact layer; the first P-type field control layer is an eighth semiconductor $p^-$-doped and deposed between the second graded bandgap layer and the N-type ohmic contact layer; the second P-type field control layer is a ninth semiconductor $p^-$-doped and deposed between the first P-type field control layer and the N-type ohmic contact layer; the third P-type field control layer is a tenth semiconductor $p^-$-doped and deposed between the second P-type field control layer and the N-type ohmic contact layer; the M-layer is an eleventh semiconductor undoped and deposed between the third P-type field control layer and the N-type ohmic contact layer; the N-type charge layer is a twelfth semiconductor $n^+$-doped and deposed between the M-layer and the N-type ohmic contact layer; the transport layer is a thirteenth semiconductor undoped and deposed between the N-type charge layer and the N-type ohmic contact layer; from top to bottom, the photodiode comprises the P-type ohmic contact layer, the P-type window layer, the first graded bandgap layer, the first absorption layer, the second absorption layer, the second graded bandgap layer, the first P-type field control layer, the second P-type field control layer, the third P-type field control layer, the M-layer, the N-type charge layer, the transport layer, and the N-type ohmic contact layer; an epitaxial-layers structure is obtained with an electrode of the M-layer being n-side down; a mixed composite charge layer comprising the first, the second, and the third P-type field control layers is formed; and a heterojunction structure comprising the first, the second, and the third P-type field control layers is obtained with a mesa shape between the first and the second P-type field control layers formed through chemical selective etching to confine the field of the M-layer at center of the photodiode with the mesa shape.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
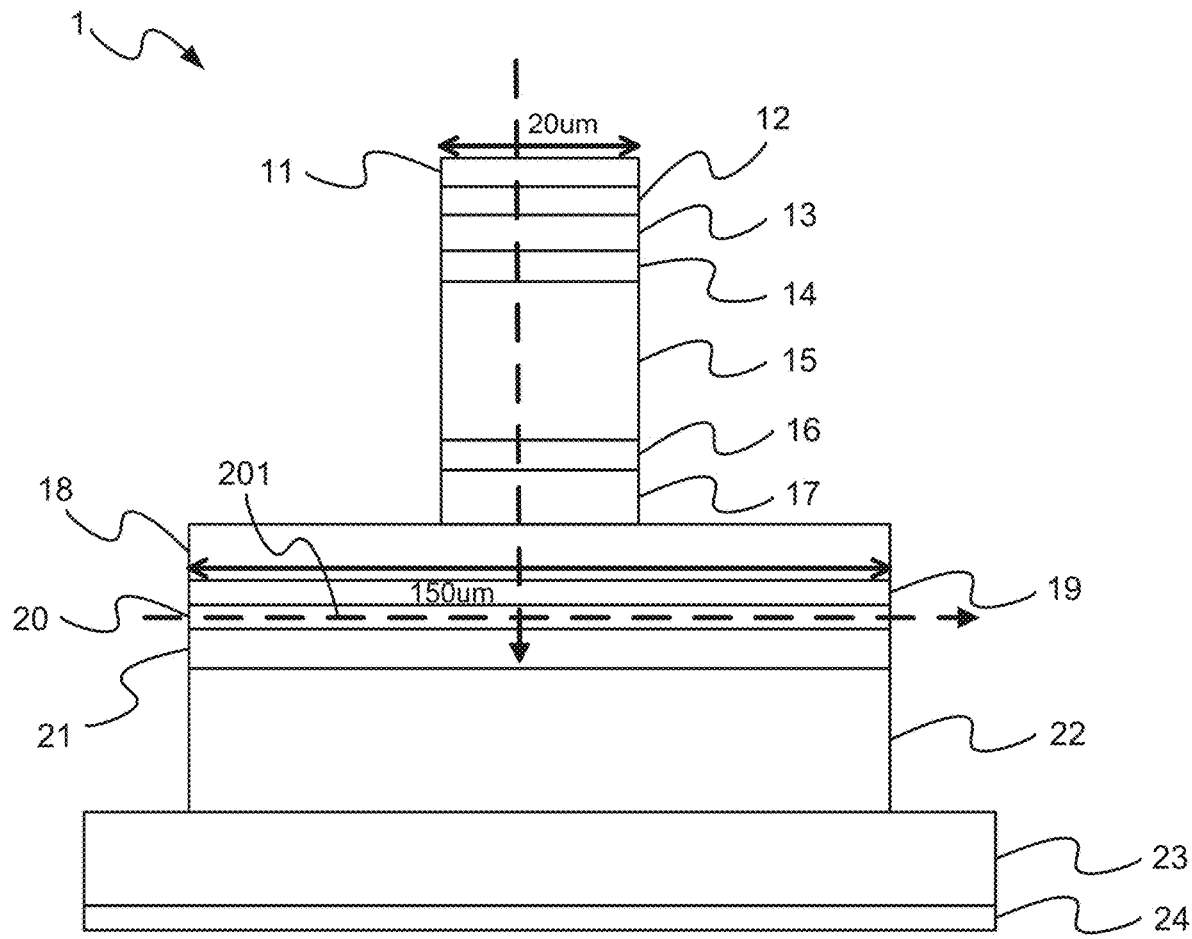
FIG. 1 is the sectional view showing the preferred embodiment according to the present invention.
Figure 2:
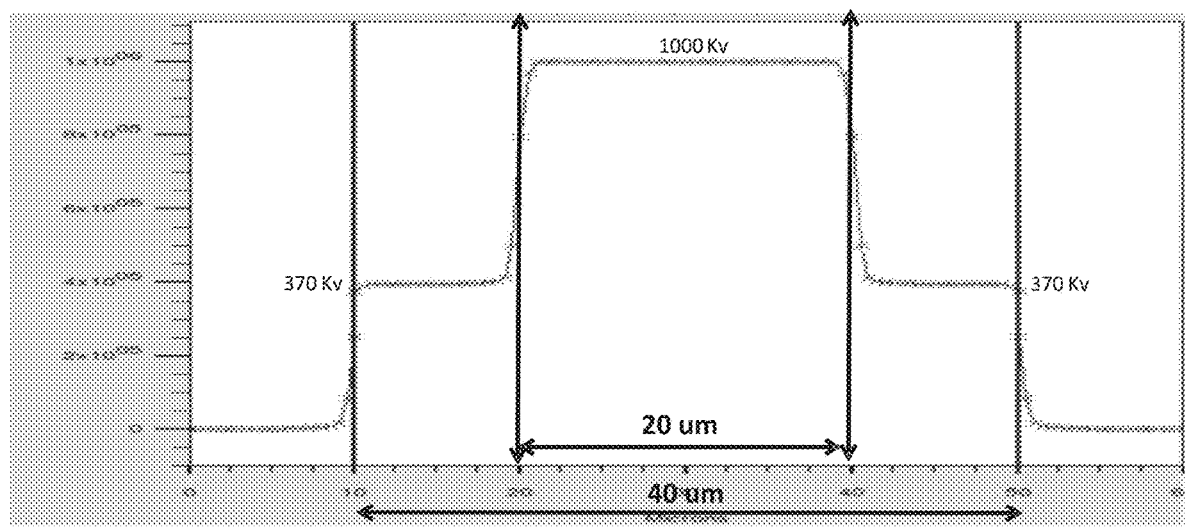
FIG. 2 is the view showing the two-dimensional (2D) field distribution at avalanche breakdown.
Figure 3:
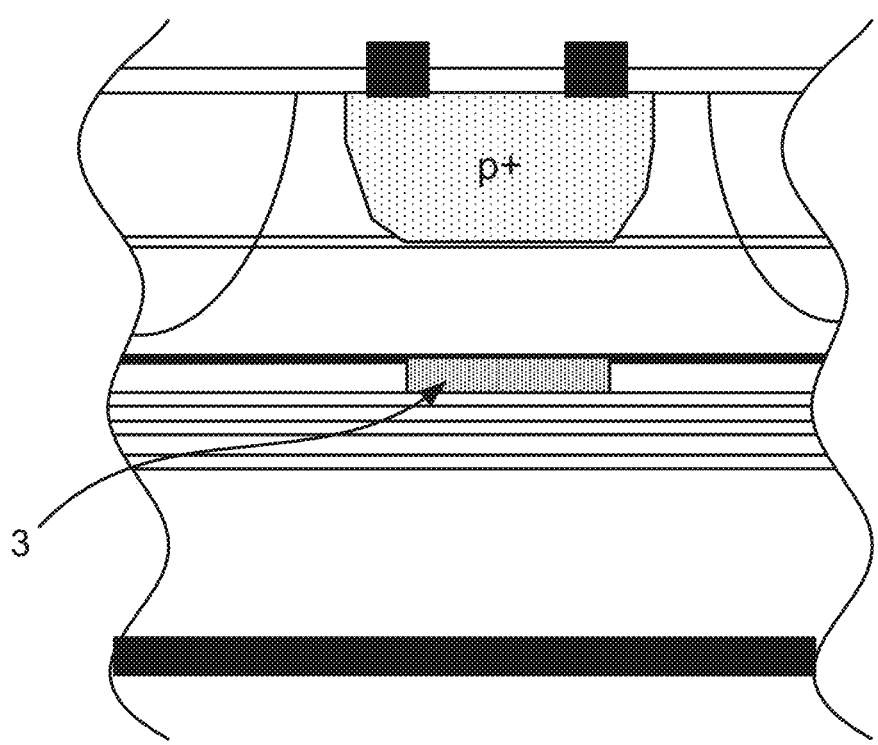
FIG. 3 and FIG. 4 are the prior arts of InAIAs avalanche photodiode (APD).
Figure 4:
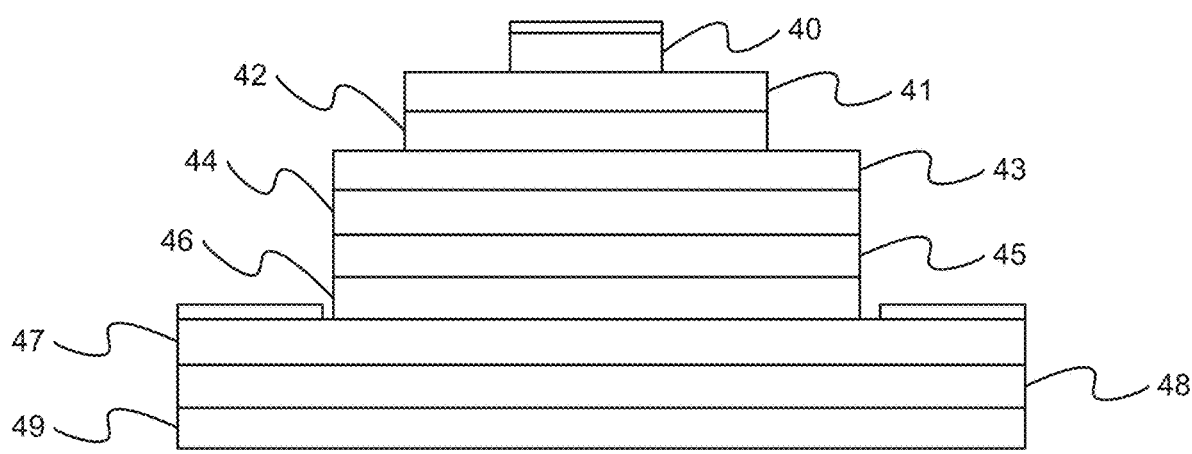

Please refer to FIG. 1 and FIG. 2, which are a sectional view showing a preferred embodiment according to the present invention; and a view showing a 2D field distribution at avalanche breakdown. As shown in the figures, the present invention is a photodiode of avalanche breakdown having a mixed composite charge layer, comprising, from top to bottom, a P-type ohmic contact layer 11, a P-type window layer 12, a first graded bandgap layer 13, a first absorption layer 14, a second absorption layer 15, a second graded bandgap layer 16, a first P-type field control layer 17, a second P-type field control layer 18, a third P-type field control layer 19, a multiplication layer (M-layer) 20, an N-type charge layer 21, a transport layer 22, and an N-type ohmic contact layer 23. Therein, an epitaxial-layers structure is formed with an electrode of M-layer being n-side down; a mixed composite charge layer comprising the first, second, and third P-type field control layers is designed; and a heterojunction structure comprising the first, second, and third P-type field control layers 17,18,19 is used with a mesa shape between the first and second P-type field control layers 17,18 obtained through chemical selective etching to confine the field of the M-layer 20 at center of the photodiode with the mesa shape.

The P-type ohmic contact layer 11 is of $p^+$-doped indium gallium arsenic phosphide (InGaAsP) used as a P-type electrode. The P-type ohmic contact layer 11 may further comprises a P-type conductive metal layer (not shown in the figures), where the P-type ohmic contact layer 11 has a thickness of 1500 angstroms (Å)±20%.

The P-type window layer 12 is of $p^+$-doped indium phosphide (InP) and clipped between the P-type ohmic contact layer 11 and the N-type ohmic contact layer 23, where the P-type field control layer 12 has a thickness of 5000 Å±20%.

The first graded bandgap layer 13 is of multilayers-graded $p^+$-doped indium gallium arsenide (InGaAs) or aluminum indium arsenide (AlInAs) and clipped between the P-type window layer 12 and the N-type ohmic contact layer 23, where the first graded bandgap layer 13 has a thickness of 120 Å±20%.

The first absorption layer 14 is of graded p$^-$-doped InGaAs and clipped between the first graded bandgap layer 13 and the N-type ohmic contact layer 23, where the first absorption layer 14 has a thickness of 4000 Å±20%.

The second absorption layer 15 is of undoped InGaAs and clipped between the first absorption layer 14 and the N-type ohmic contact layer 23, where the second absorption layer 15 has a thickness of 3500 Å±20%.

The second graded bandgap layer 16 is of undoped InGaAs or AlInAs and clipped between the second absorption layer 15 and the N-type ohmic contact layer 23, where the second graded bandgap layer 16 has a thickness of 80 Å±20%.

The first P-type field control layer 17 is of p$^-$-doped InAlAs and clipped between the second graded bandgap layer 16 and the N-type ohmic contact layer 23, where the first P-type field control layer 17 has a thickness of 600 Å±20%.

The second P-type field control layer 18 is of p$^-$-doped InP and clipped between the first P-type field control layer 17 and the N-type ohmic contact layer 23, where the second P-type field control layer 18 has a thickness of 300 Å±20%.

The third P-type field control layer 19 is of p$^-$-doped InAlAs and clipped between the second graded bandgap layer 18 and the N-type ohmic contact layer 23, where the third p-type field control layer 19 has a thickness of 300 Å±20%.

The M-layer 20 is of undoped InAlAs and clipped between the third P-type field control layer 19 and the N-type ohmic contact layer 23, where the M-layer 20 has a thickness of 880 Å±20%.

The N-type charge layer 21 is of n$^+$-doped InAlAs and clipped between the M-layer 20 and the N-type ohmic contact layer 23, where the N-type charge layer 21 has a thickness of 750 Å±20%.

The transport layer 22 is of undoped InP and clipped between the N-type charge layer 21 and the N-type ohmic contact layer 23, where the transport layer 22 has a thickness of 6000 Å±20%.

The N-type ohmic contact layer 23 is of n$^+$-doped InP used as a P-type electrode and the N-type ohmic contact layer 23 further comprises an N-type conductive metal layer (not shown in the figures), where the N-type ohmic contact layer 23 has a thickness of 10000 Å±20%.

The present invention grows an epitaxial-layers structure 1 on a semi-insulating or conductive semiconductor substrate (not shown in the figures) and a buffer layer 24 is further obtained between the N-type ohmic contact layer 23 and the semiconductor substrate, where the semiconductor substrate is of composite, like gallium arsenide (GaAs), gallium antimonide (GaSb), InP, or gallium nitride (GaN); or, of IV-group element, like silicon (Si); and the transport layer 24 is of undoped InP, having a thickness of 500 Å±20%.

Thus, a novel photodiode of avalanche breakdown having a mixed composite charge layer is obtained.

The P-type ohmic contact layer 11 is of p$^+$-type In$_{1-x}$Ga$_x$As$_y$P$_{1-y}$; and x is 0.52 and y is 0.45.

The first absorption layer 14 is of graded p$^-$-doped In$_x$Ga$_{1-x}$As and the second absorption layer 15 is of undoped In$_x$Ga$_{1-x}$As, where x is 0.53.

The first and the third P-type field control layers 17,19 are of p$^-$-doped In$_x$Al$_{1-x}$As, the M-layer 20 is of undoped In$_x$Al$_{1-x}$As, and the N-type charge layer 21 is of n$^+$-doped In$_x$Al$_{1-x}$As, where x is 0.52.

The growth method for the epitaxial-layers structure 1 is not limited, where molecular beam epitaxy (MBE), metalorganic chemical vapor deposition (MOCVD), and hydride vapor phase epitaxy (HVPE) are preferred for growing on a semiconductor substrate.

On consideration of reliability, an epitaxial-layers structure with n-side down is used, where the strongest field of the M-layer 20 is coated in inner bottom layers to avoid surface breakdown. As compared to prior arts, the present invention is designed with a mixed composite charge layer, where a single P-type field control layer is divided into three layers of different materials with each two neighboring layers forming a heterojunction structure. By controlling the relative concentration distributions and thicknesses of the first, second, and third P-type field control layers 17,18,19 along with a mesa shape formed through chemical selective etching as having the first P-type field control layer 17 and the second P-type field control layer 18 separately of p$^-$-doped InAlAs and InP and both being selectively etchable, a part of the second P-type field control layer 18 is exposed to the air with a part of the first P-type field control layer 17 being etched out at the same time through this single structure having the mesa shape. Furthermore, the field of the M-layer 20 is further confined at center of the structure to concentrate power, so that fringe field is low but not collapsed; overall speed is increased; and strength is improved.

Nevertheless, the M-layer 20 has to have a very high field at the center. With the above design for the present invention, the field can reach 1000 kilo volts (kv) for the very high field at the center of the M-layer 20. As shown in FIG. 2, under the mesa shape (under the part of 20 micrometers (um)), the M-layer 20 has 1000 kv at the dash lines 201 (as shown in FIG. 1) while the fringe field is depressed to 370 kv outside of the 20 um part without being crashed. It is because that the mesa shape is etched out between the first P-type field control layer 17 and the second P-type field control layer 18 to make the speed fast and, thus, to obtain a fast response speed and a high efficiency rate for the APD.

As shown in FIG. 2, the confinement is particularly strong in the x-direction at the center of the field, where the good confinement at center makes the fringe field small.

As is described above, the present invention is a novel APD of InAlAs having a mixed composite charge layer, where a single P-type field control layer is divided into three layers of different materials with each two neighboring layers forming a heterojunction structure; by controlling the relative concentration distributions and thicknesses of the first, second, and third P-type field control layers along with a mesa shape formed through chemical selective etching, a part of the second P-type field control layer is exposed to the air with a part of the first P-type field control layer being etched out at the same time through a single structure having the mesa shape; furthermore, the field of an M-layer is further confined at center of the structure to concentrate power so that fringe field is low but not collapsed; and, hence, overall speed is increased, intensity is high, and the photodiode of avalanche breakdown has a good sensitivity, a fast response speed, and a high efficiency rate. Thus, the present invention can be applied to develop high-speed (greater than 25 giga-bits per second) and high linear APDs for high-capacity- and long-distance-transmission Ethernet.

To sum up, the present invention is a photodiode of avalanche breakdown having a mixed composite charge layer, where a mixed composite charge layer is used; a single P-type field control layer is divided into three layers of different materials with each two neighboring layers forming a heterojunction structure; by controlling the relative concentration distributions and thicknesses of the first, second, and third P-type field control layers along with a mesa shape formed through chemical selective etching, a part of the second P-type field control layer is exposed to the air with a part of the first P-type field control layer being etched out at the same time through a single structure having a mesa shape; and, thus, the field of an M-layer is further confined at center to concentrate power so that fringe field is low but not collapsed with increased speed and high intensity for the whole structure.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An avalanche breakdown photodiode having a mixed composite charge layer, comprising
    a P-type ohmic contact layer, said P-type ohmic contact layer being a first semiconductor $p^+$-doped;
    an N-type ohmic contact layer, said N-type contact layer being a second semiconductor $n^+$-doped;
    a P-type window layer, said P-type window layer being a third semiconductor $p^-$-doped and deposed between said P-type ohmic contact layer and said N-type ohmic contact layer;
    a first graded bandgap layer, said first graded bandgap layer being a fourth semiconductor $p^+$-doped and deposed between said P-type window layer and said N-type ohmic contact layer;
    a first absorption layer, said first absorption layer being a fifth semiconductor $p^-$-doped and deposed between said first graded bandgap layer and said N-type ohmic contact layer;
    a second absorption layer, said second absorption layer being a sixth semiconductor undoped and deposed between said first absorption layer and said N-type ohmic contact layer;
    a second graded bandgap layer, said second graded bandgap layer being a seventh semiconductor undoped and deposed between said second absorption layer and said N-type ohmic contact layer;
    a first P-type field control layer, said first P-type field control layer being an eighth semiconductor $p^-$-doped and deposed between said second graded bandgap layer and said N-type ohmic contact layer;
    a second P-type field control layer, said second P-type field control layer being a ninth semiconductor $p^-$-doped and deposed between said first P-type field control layer and said N-type ohmic contact layer;
    a third P-type field control layer, said third P-type field control layer being a tenth semiconductor $p^-$-doped and deposed between said second P-type field control layer and said N-type ohmic contact layer;
    a multiplication layer (M-layer), said M-layer being an eleventh semiconductor undoped and deposed between said third P-type field control layer and said N-type ohmic contact layer;
    an N-type charge layer, said N-type charge layer being a twelfth semiconductor $n^+$-doped and deposed between said M-layer and said N-type ohmic contact layer; and
    a transport layer, said transport layer being a thirteenth semiconductor undoped and deposed between said N-type charge layer and said N-type ohmic contact layer,
    wherein, from top to bottom, the photodiode comprises said P-type ohmic contact layer, said P-type window layer, said first graded bandgap layer, said first absorption layer, said second absorption layer, said second graded bandgap layer, said first P-type field control layer, said second P-type field control layer, said third P-type field control layer, said M-layer, said N-type charge layer, said transport layer, and said N-type ohmic contact layer;
    an epitaxial-layers structure is obtained with an electrode of said M-layer being n-side down;
    a mixed composite charge layer comprising said first, said second, and said third P-type field control layers is obtained; and
    a heterojunction structure comprising said first, said second, and said third P-type field control layers is obtained with a mesa shape between said first and said second P-type field control layers obtained through chemical selective etching to confine the field of said M-layer at center of the photodiode with said mesa shape,
        wherein said P-type ohmic contact layer is of $p^+$-type indium gallium arsenic phosphide (InGaAsP);
        said P-type window layer is of $p^+$-type indium phosphide (InP);
        said first graded bandgap layer is of $p^+$-type indium gallium arsenide (InGaAs);
        said first absorption layer is of graded $p^-$-doped InGaAs;
        said second absorption layer is of undoped InGaAs;
        said second graded bandgap layer is of undoped InGaAs;
        said first P-type field control layer is of $p^-$-doped indium aluminum arsenide (InAlAs);
        said second P-type field control layer is of $p^-$-doped InP;
        said third P-type field control layer is of $p^-$-doped InAlAs;
        said M-layer is of undoped InAlAs; said N-type charge layer is of $n^+$-doped InAlAs;
        said transport layer is of undoped InP; and
        said N-type ohmic contact layer is of $n^+$-doped InP.

2. The photodiode according to claim 1,
    wherein said epitaxial-layers structure is grown on a semiconductor substrate selected from a group consisting of a semi-insulating semiconductor substrate and a conductive semiconductor substrate; and a buffer layer is further obtained between said N-type ohmic contact layer and said semiconductor substrate.

3. The photodiode according to claim 1,
    wherein said P-type ohmic contact layer is of $p^+$-type $In_{1-x}Ga_xAs_yP_{1-y}$, and x is 0.52 and y is 0.45.

4. The photodiode according to claim 1,
    wherein said first absorption layer is of graded $p^-$-doped $In_xGa_{1-x}As$, said second absorption layer is of undoped $In_xGa_{1-x}As$, and x is 0.53.

5. The photodiode according to claim 1,
    wherein said first and said third P-type field control layers are of $p^-$-doped $In_xAl_{1-x}As$ and x is 0.52.

6. The photodiode according to claim 1, wherein said M-layer is of undoped $In_xAl_{1-x}As$ and x is 0.52.

7. The photodiode according to claim 1, wherein said N-type charge layer is of $n^+$-doped $In_xAl_{1-x}As$ and x is 0.52.

8. The photodiode according to claim 1, wherein said first P-type field control layer has a thickness of 600 angstroms (Å)±20% and each of said second and said third P-type field control layers has a thickness of 300 Å±20%.

9. An avalanche breakdown photodiode having a mixed composite charge layer, comprising a P-type ohmic contact layer, said P-type ohmic contact layer being a first semiconductor $p^+$-doped;

an N-type ohmic contact layer, said N-type contact layer being a second semiconductor $n^+$-doped;

a P-type window layer, said P-type window layer being a third semiconductor $p^+$-doped and deposed between said P-type ohmic contact layer and said N-type ohmic contact layer;

a first graded bandgap layer, said first graded bandgap layer being a fourth semiconductor $p^+$-doped and deposed between said P-type window layer and said N-type ohmic contact layer;

a first absorption layer, said first absorption layer being a fifth semiconductor $p^-$-doped and deposed between said first graded bandgap layer and said N-type ohmic contact layer;

a second absorption layer, said second absorption layer being a sixth semiconductor undoped and deposed between said first absorption layer and said N-type ohmic contact layer;

a second graded bandgap layer, said second graded bandgap layer being a seventh semiconductor undoped and deposed between said second absorption layer and said N-type ohmic contact layer;

a first P-type field control layer, said first P-type field control layer being an eighth semiconductor $p^-$-doped and deposed between said second graded bandgap layer and said N-type ohmic contact layer;

a second P-type field control layer, said second P-type field control layer being a ninth semiconductor $p^-$-doped and deposed between said first P-type field control layer and said N-type ohmic contact layer;

a third P-type field control layer, said third P-type field control layer being a tenth semiconductor $p^-$-doped and deposed between said second P-type field control layer and said N-type ohmic contact layer;

a multiplication layer (M-layer), said M-layer being an eleventh semiconductor undoped and deposed between said third P-type field control layer and said N-type ohmic contact layer;

an N-type charge layer, said N-type charge layer being a twelfth semiconductor $n^+$-doped and deposed between said M-layer and said N-type ohmic contact layer; and a transport layer, said transport layer being a thirteenth semiconductor undoped and deposed between said N-type charge layer and said N-type ohmic contact layer, wherein, from top to bottom, the photodiode comprises said P-type ohmic contact layer, said P-type window layer, said first graded bandgap layer, said first absorption layer, said second absorption layer, said second graded bandgap layer, said first P-type field control layer, said second P-type field control layer, said third P-type field control layer, said M-layer, said N-type charge layer, said transport layer, and said N-type ohmic contact layer;

an epitaxial-layers structure is obtained with an electrode of said M-layer being n-side down;

a mixed composite charge layer comprising said first, said second, and said third P-type field control layers is obtained; and a heterojunction structure comprising said first, said second, and said third P-type field control layers is obtained with a mesa shape between said first and said second P-type field control layers obtained through chemical selective etching to confine the field of said M-layer at center of the photodiode with said mesa shape, wherein said P-type ohmic contact layer is of $p^+$-type InGaAsP;

said P-type window layer is of $p^+$-type InP;

said first graded bandgap layer is of $p^+$-type InAlAs;

said first absorption layer is of graded $p^-$-doped InGaAs;

said second absorption layer is of undoped InGaAs;

said second graded bandgap layer is of undoped InAlAs;

said first P-type field control layer is of $p^-$-doped InAlAs;

said second P-type field control layer is of $p^-$-doped InP;

said third P-type field control layer is of $p^-$-doped InAlAs;

said M-layer is of undoped InAlAs;

said N-type charge layer is of $n^+$-doped InAlAs;

said transport layer is of undoped InP; and said N-type ohmic contact layer is of $n^+$-doped InP.

* * * * *